United States Patent
Toh et al.

(10) Patent No.: US 9,219,044 B2
(45) Date of Patent: Dec. 22, 2015

(54) PATTERNED PHOTORESIST TO ATTACH A CARRIER WAFER TO A SILICON DEVICE WAFER

(71) Applicants: Chin Hock Toh, Singapore (SG); Aksel Kitowski, Singapore (SG); Uday Mahajan, Singapore (SG); Thean Ming Tan, Singapore (SG)

(72) Inventors: Chin Hock Toh, Singapore (SG); Aksel Kitowski, Singapore (SG); Uday Mahajan, Singapore (SG); Thean Ming Tan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 10 days.

(21) Appl. No.: 14/083,352

(22) Filed: Nov. 18, 2013

(65) Prior Publication Data

US 2015/0140801 A1    May 21, 2015

(51) Int. Cl.

| H01L 21/30 | (2006.01) |
|---|---|
| H01L 21/00 | (2006.01) |
| H01L 21/46 | (2006.01) |
| H01L 21/44 | (2006.01) |
| H01L 23/00 | (2006.01) |

(52) U.S. Cl.
CPC .............. *H01L 24/11* (2013.01); *H01L 24/75* (2013.01); *H01L 2924/181* (2013.01)

(58) Field of Classification Search
CPC .......... H01L 2224/73204; H01L 2224/73203; H01L 2224/97; H01L 24/13; H01L 24/81; H01L 2224/81; H01L 21/568; H01L 2224/29011; H01L 2225/06513; H01L 2224/13; H01L 2224/16148

USPC ................. 438/458–460, 464, 612–613; 257/E21.508, E21.599
See application file for complete search history.

(56) References Cited

U.S. PATENT DOCUMENTS

| 5,512,780 | A | * | 4/1996 | Davidson ................. 257/668 |
|---|---|---|---|---|
| 6,214,733 | B1 | * | 4/2001 | Sickmiller ................. 438/691 |
| 6,440,836 | B1 | * | 8/2002 | Lu et al. ................. 438/612 |
| 8,130,509 | B2 | * | 3/2012 | Tsai ................. H01L 24/05 257/529 |
| 8,193,084 | B2 | * | 6/2012 | Sutou ................. H01L 24/11 257/E21.509 |
| 8,455,289 | B1 | * | 6/2013 | Adler et al. ................. 438/53 |
| 9,035,455 | B2 | * | 5/2015 | Sameshima ........... H01L 23/525 257/737 |
| 2003/0011866 | A1 | * | 1/2003 | Little et al. ................. 359/290 |
| 2006/0246706 | A1 | * | 11/2006 | Ke ................. H01L 24/11 438/613 |
| 2009/0093075 | A1 | * | 4/2009 | Chu et al. ................. 438/33 |
| 2013/0285259 | A1 | * | 10/2013 | Han ................. 257/777 |
| 2014/0084453 | A1 | * | 3/2014 | Daubenspeck et al. ....... 257/737 |
| 2014/0141569 | A1 | * | 5/2014 | Jo ................. H01L 21/50 438/109 |

* cited by examiner

*Primary Examiner* — Mohsen Ahmadi
(74) *Attorney, Agent, or Firm* — Blakely, Sokoloff, Taylor & Zafman LLP

(57) ABSTRACT

Patterned photoresist is used to attach a carrier wafer to a silicon device wafer. In one example, a silicon wafer is patterned for contact bumps by applying a photoresist over a surface of the wafer and removing the photoresist in locations at which the contact bumps are to be formed. The contact bumps are formed in the locations at which the photoresist is removed. A temporary carrier is attached to the photoresist over the wafer. The back side of the wafer opposite the contact bumps is processed while handling the wafer using the temporary carrier. The temporary carrier is removed. The photoresist on the front side of the wafer with the contact bumps is removed after removing the temporary carrier.

16 Claims, 9 Drawing Sheets

US 9,219,044 B2

PATTERNED PHOTORESIST TO ATTACH A CARRIER WAFER TO A SILICON DEVICE WAFER

FIELD

The present description relates to the field of carrier wafer attachment for semiconductor wafer handling.

DISCUSSION OF RELATED ART

Semiconductor and micromechanical devices are often constructed in groups on a silicon wafer. After the wafer is fully processed, the wafer is diced into individual chips. During processing, the wafer can be moved into different chambers for exposure to various coating, etching, cleaning, and photolithography processes. As the wafers are made thinner and larger to reduce weight, size, and cost, the wafers become increasingly more difficult to handle without breaking. In addition for many of the processes, extreme temperature and chemical environments are used. As a result, carrier wafers are attached to the device wafer. The carrier wafer provides a handle by which the device wafer can be moved and held in place through fabrication processes.

In a conventional bumping flow, a UBM (Under Bump Metallurgy) is sputtered across a dielectric patterned silicon wafer. PR (Photoresist) is then coated and patterned to form openings that define the size of copper or solder bumps. Copper or solder plating may result in variations in the vertical dimensional height of the bumps. These variations can be more than 5%. After the copper or solder plating, the PR is stripped and the UBM that is not protected by a bump is etched away. The solder bumps are then reflowed in a furnace. In the fabrication of TSV (Through-Silicon Via) silicon wafers, the high topography bumps are sometimes used as attachment points for a temporary carrier. The temporary carrier is used to handle the silicon wafer so that the wafer can be thinned and the back side of the TSVs can be revealed.

BRIEF DESCRIPTION OF THE DRAWING FIGURES

Embodiments of the present invention are illustrated by way of example, and not limitation, in the figures of the accompanying drawings.

SUMMARY

Patterned photoresist is used to attach a carrier wafer to a silicon device wafer. In one example, a silicon wafer is patterned for contact bumps by applying a photoresist over a surface of the wafer and removing the photoresist in locations at which the contact bumps are to be formed. The contact bumps are formed in the locations at which the photoresist is removed. A temporary carrier is attached to the photoresist over the wafer. The back side of the wafer opposite the contact bumps is processed while handling the wafer using the temporary carrier. The temporary carrier is removed. The photoresist on the front side of the wafer with the contact bumps is removed after removing the temporary carrier.

DETAILED DESCRIPTION

Embodiments of the present invention allow packages, such as 3DIC (Three-dimensional Integrated Circuit) packages, to be constructed in part by bonding a carrier to the front side of a wafer using photoresist. Plated copper connection bumps on a wafer may be bonded by adhesive or bonded electrostatically to a temporary carrier in the presence of the photoresist, or the carrier can be bonded directly to the photoresist. The photoresist is then stripped off after the carrier is debonded or de-chucked. The rest of the operations in forming the copper connection bumps, such as UBM (Under-Bump Metallurgy), and cleaning can also be performed after the debonding or de-chucking.

In embodiments of the invention, silicon wafers with or without contact bumps are bonded or electrostatically chucked to a temporary carrier in the presence of a pattern or photo-sensitive polymer, such as photoresist. In some embodiments, the polymer is patterned and the plated bumps are formed based on the pattern. Stripping and etching are done after the carrier is debonded or de-chucked. In some embodiments, CMP (Chemical Mechanical Polishing), diamond cutting, or another technique is used to level the pattern polymer with the plated bump before the temporary carrier is attached. The polishing planarizes both the plated bumps and the pattern polymer before carrier bonding or e-chucking.

The pattern polymer, e.g. photoresist, provides a larger and mostly flat bonding surface for the temporary carrier. This allows the temporary carrier to bond more reliably and securely to the wafer. Planarizing the plated bumps with the photoresist also reduces variations in height between the many bumps on the wafer. This can be a benefit when connecting the plated bump to another device, such as another die, a logic board, or an interposer, whether in a flip-chip, stacked, or other type of package.

Figure 1A:
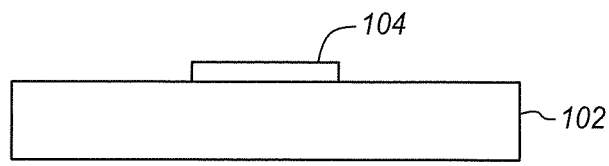
FIGS. 1A to 1L are cross-sectional diagrams of a sequence of wafer level processing stages for bonding a carrier wafer to patterned photoresist according to an embodiment of the invention.

FIGS. 1A to 1H show processing stages for attaching a temporary carrier wafer to a wafer being processed with plated bumps. In FIG. 1A, a portion of a silicon wafer 102 is shown having a conductive pad or land 104. Only one pad is shown for simplicity while an actual wafer may have hundreds, thousands, or more such pads or lands. The wafer has been processed through various stages to create one or more layers of active or passive semiconductor circuitry or other devices on the front side of the wafer. The front side is shown here as the top side. The pad provides one of many input and output connections to the circuitry that has been formed on the silicon substrate of the wafer.

Figure 1B:
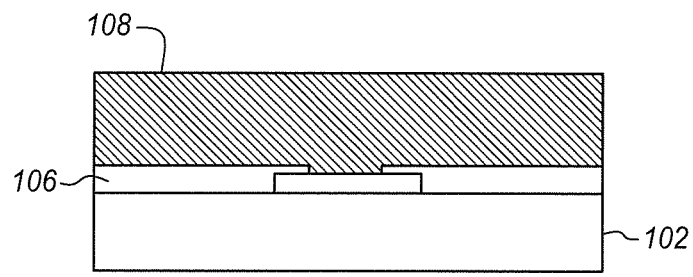
Figure 1C:
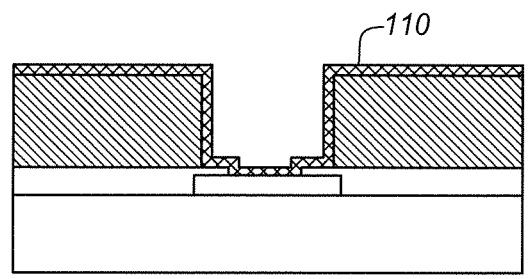
Figure 1D:
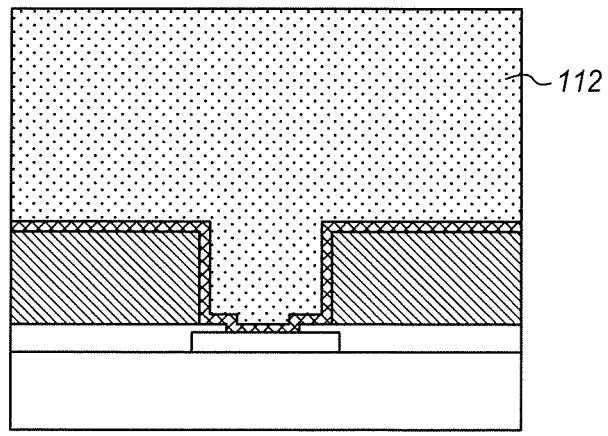

In FIG. 1B, a dielectric layer 106 is formed over the top of the wafer to isolate the pads from each other and the polymer layer 108 is formed over the dielectric to provide structure for the coming bumps. In FIG. 1C, the polymer is patterned using, for example photolithography, to expose the pads. A CBS (Copper Barrier Seed) layer 110 is formed over the polymer layer. This layer promotes adhesion of the coming bumps to the pad.

Figure 1E:
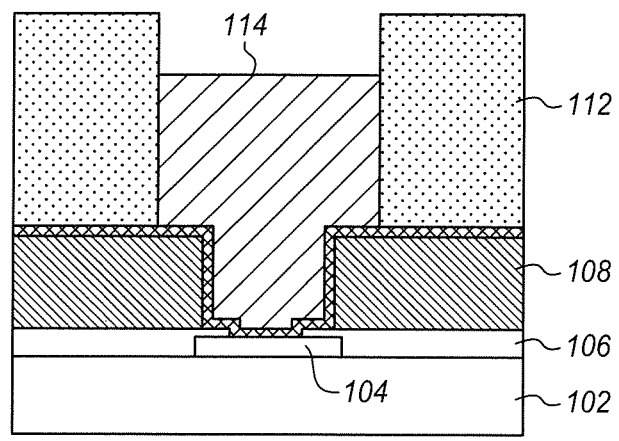

In FIG. 1C a layer of photoresist 112 is applied over the surface of the wafer. This photoresist is patterned to form still larger openings over the pads and the openings are filled with copper 114 as shown in FIG. 1E to from copper bumps. After the wafer is diced, each die will use the copper bumps to connect to external devices. Typically the bumps are connected to a package substrate and the package substrate is then attached to a system or logic board, however, the invention is not so limited.

Figure 1F:
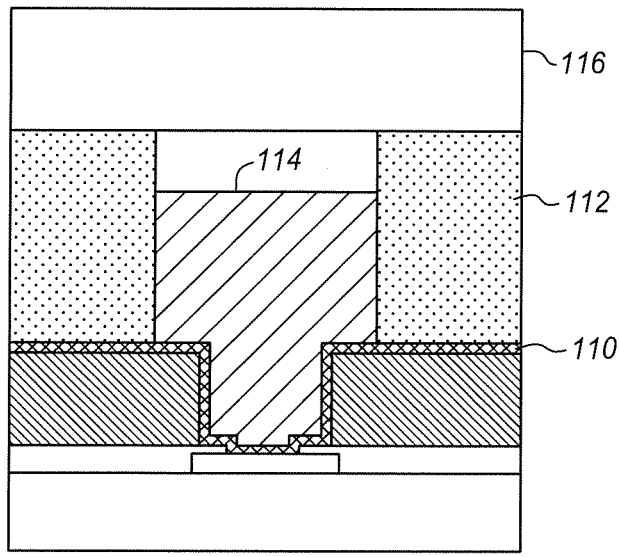

In FIG. 1F, while the photoresist 112 remains over the wafer 102, a carrier wafer 116 is attached over the photoresist. The carrier wafer may be attached with adhesive, with electrostatic force, or in any of a variety of other ways, depending on the particular implementation.

The photoresist provides a surface to which the temporary carrier can be attached. Although not shown in the simplified diagrams, the copper bumps typically cover a very small part of the total surface area of the front side of the wafer. The copper bumps may cover less than 5% and as low as or lower than 2% of the front side of the wafer. If the carrier 116 were attached to the copper bumps, then there would be no connection to 98% of the surface of the wafer. By connecting to the other 98% of the surface of the wafer, the attachment of the temporary carrier is made more secure.

The temporary carrier allows the wafer 102 to be further processed on the back side of the wafer. A carrier or chuck (not shown) is removed from the back side of the wafer and the wafer is held by the carrier or chuck 116 attached to the front side of the wafer. There may be many different processes applied to the back side of the wafer. These may include thinning the substrate, embedding the dies in a molding compound, forming additional components on the back side of the wafer, drilling vias or other types of connections through the substrate to connect to the circuit, and many other processes. During any or all of these processes, the temporary carrier attached to the photoresist provides a secure hold on the wafer.

Figure 1G:
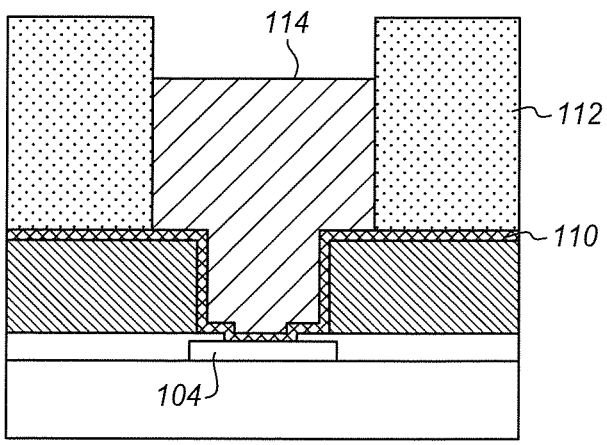
Figure 1H:
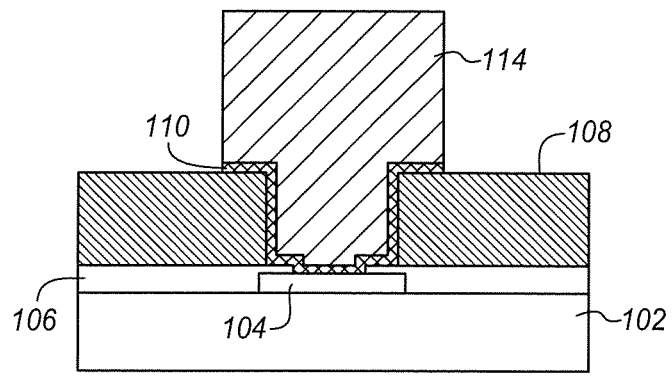

After this processing is completed, a temporary carrier or chuck is attached to the back side of the wafer (not shown) to allow the front side of the wafer to be finished. In FIG. 1G, the front side carrier 116 is removed from the photoresist 112, exposing the photoresist and the copper bump again. In FIG. 1H, the photoresist is etched away and the surface is cleaned to expose the copper bumps 114 for connection to an external device. The wafer may then be attached to a substrate, diced, packaged, or otherwise processed, depending on the particular implementation.

Figure 1I:
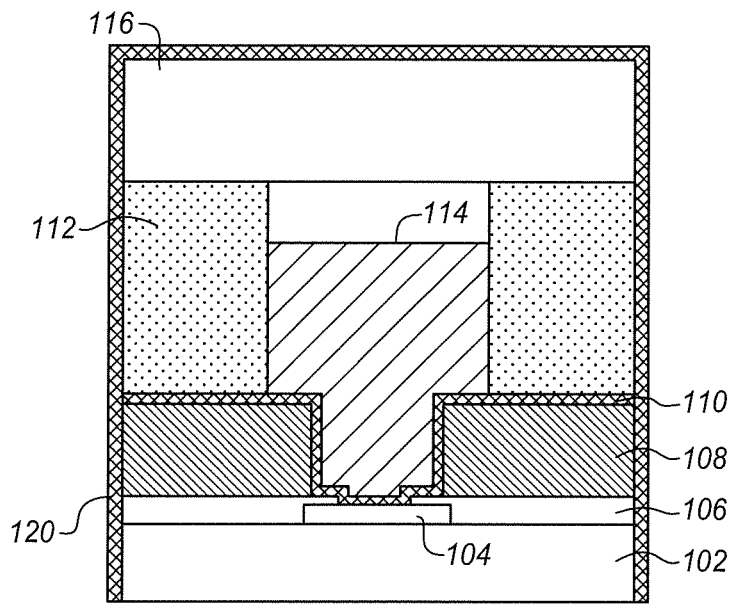

FIG. 1I shows a variation to the processes above in which a hermetic film is deposited on the device wafer 102 across the top over the carrier wafer and around the edges. This may be done after the carrier wafer is bonded as in FIG. 1F or at another appropriate time in the process as shown, for example, in FIG. 1L. The hermetic film 120 may be a compressive silicon nitride or similar film applied using chemical vapor deposition or similar techniques. While the film is shown as extending up the sides of the one metal pad, in a real implementation there may be thousands or millions of metal pads or copper bumps and the hermetic seal will extend across the whole wafer and up the sides only along the periphery of the whole wafer. It is unlikely that any one metal pad will have the hermetic seal on two sides.

The hermetic seal may be applied over any part of the wafer and other structures, however, one function of the layer is to seal the photoresist. Many types of photoresist outgas at elevated heat, low pressure, and in other environments. The outgassed compounds contaminate other processes and may even react with other reaction elements at a process station to change the results of the process. The hermetic seal, when applied over the photoresist, reduces the outgassing of the photoresist and any other sealed structures as the wafer is transported, positioned, and processed in various processing stages. In the present example, the temporary carrier 116 is attached to allow the back side of the substrate 102 to be processed. During this back side processing the photoresist 112 remains on the wafer attached to the temporary carrier 116. Sealing the photoresist prevents the photoresist outgassing from interfering with this back side processing.

Figure 1J:
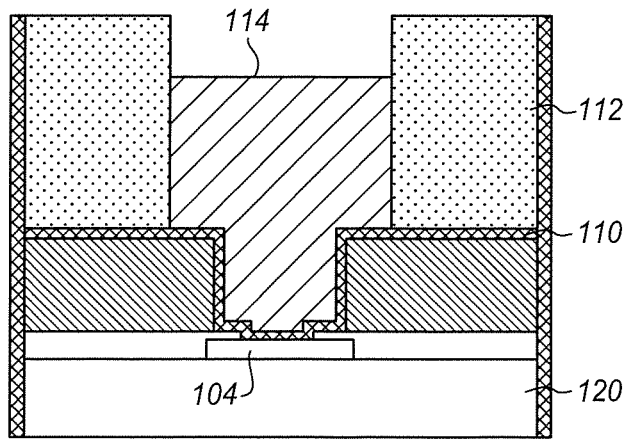
Figure 1K:
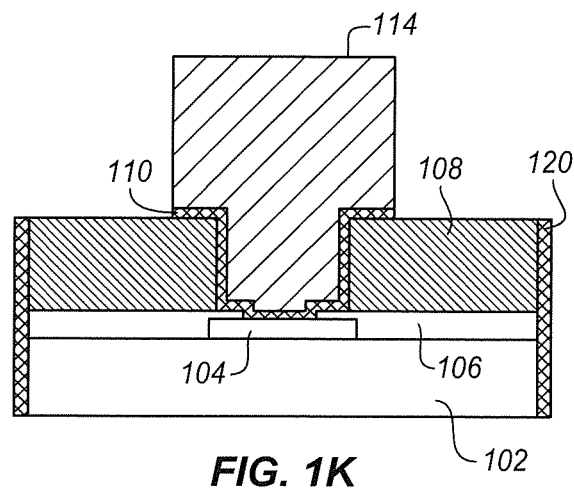

The wafer of FIG. 1I is finished in a manner similar to that shown in FIGS. 1G and 1H. In FIG. 1J, the front side temporary carrier wafer 116 is removed. Additional processing can be performed on the front side of the wafer while the photoresist is sealed. In FIG. 1K, the photoresist and the hermetic seal layer around the photoresist are removed. The seal layer that remains around the polymer layer 108 and the dielectric layer may typically be allowed to remain in place without affecting the operation of the device. It may alternatively be removed to suit other implementations.

Figure 1L:
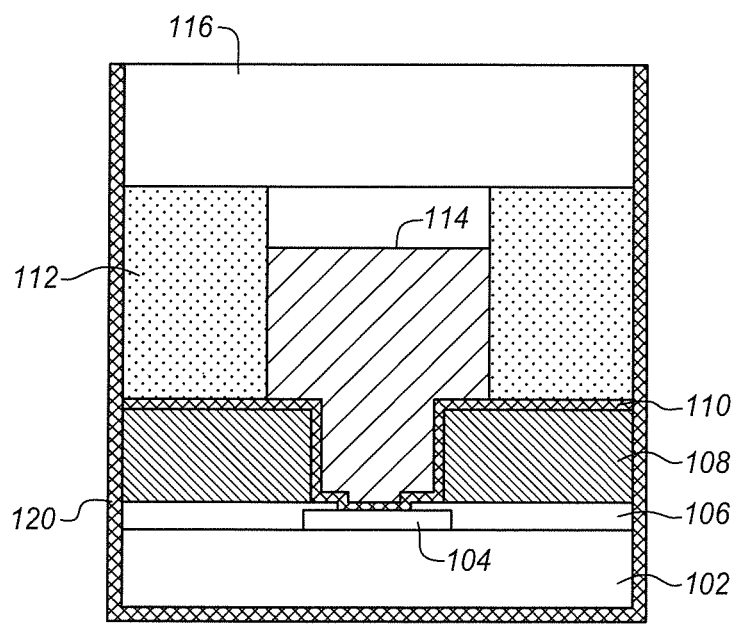

FIG. 1L is an alternative to FIG. 1I. In this example, the wafer is held by the upper temporary carrier wafer as the hermetic seal is applied. The sealing layer 220 is accordingly along both sides and across the bottom. The wafer may then be processed in the same way as with FIG. 1I. The hermetic seal along the bottom will typically be removed during the baskc side processing while the wafer is held by the front side temporary carrier wafer. The end result is a wafer with a protective layer only on the sides as shown in FIG. 1J. As with the example of FIGS. 1I to 1K, the sealing layer may be removed after the photoresist is removed using any of a variety of different techniques.

Figure 2A:
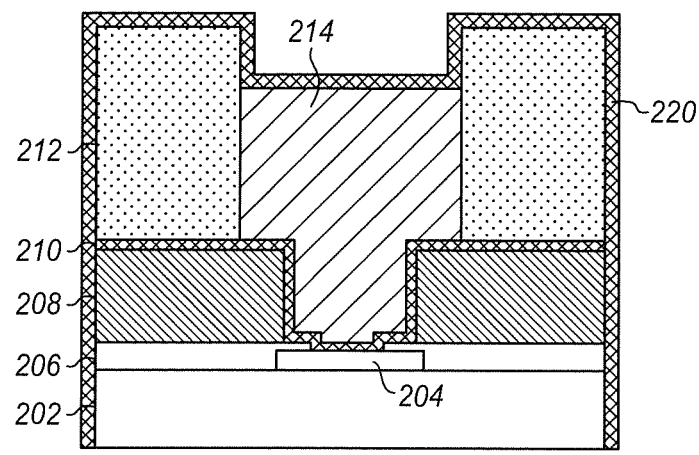
FIGS. 2A to 2E are alternative cross-sectional diagrams of a sequence of wafer level processing stages for bonding a carrier wafer to patterned photoresist according to an embodiment of the invention.

FIGS. 2A to 2E show a variation of the process described above for FIGS. 1A to 1H. FIG. 2A shows a portion of a silicon substrate 202 such as portion of a wafer with a pad 204 formed on the front side of the wafer. The pad and the surface of the wafer are covered in a dielectric 206 over the wafer and a polymer 208 over the dielectric that is patterned to expose the land. A CBS layer 210 is sputtered over the pad and photoresist 212 is deposited over the CBS and then patterned to expose the CBS over the land 204. A conductive metal bump 214, such as copper is formed over the land within openings in the patterned photoresist. Accordingly, FIG. 2A is very similar to FIG. 1E.

The entire structure may be covered in a sealing layer 220 to prevent the photoresist from impacting processing operations by outgassing. The sealing layer covers all exposed surfaces of the substrate, dielectric, polymer, CBS layer and photoresist. It may be applied by CVD or another process. SiN or another suitable material that will reduce outgassing from the photoresist may be used. The sealing layer is optional and the particular choice of sealing material and whether to apply depends on the nature of the photoresist and the nature of the processes to which the photoresist will be exposed.

Figure 2B:
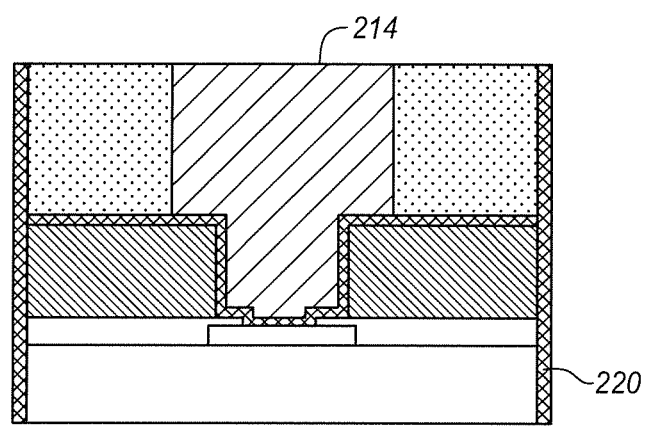
Figure 2C:
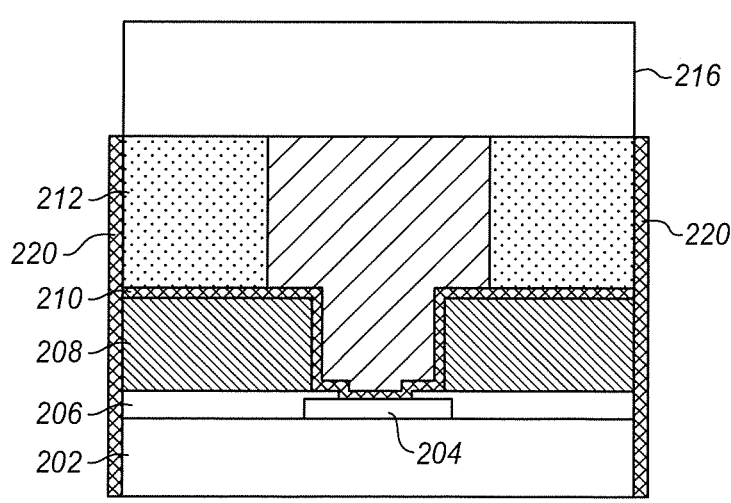

In FIG. 2B, instead of attaching a temporary carrier, such as a wafer 216, directly to the photoresist, the top surface of the wafer is first treated. In the illustrated example, the top surface of the wafer is planarized. This can be done with CMP (Chemical Mechanical Polishing), diamond cutting, or in a variety of other ways. In the illustrated example, the top surface is completely level, however, this is not necessary. In one embodiment, the photoresist is planarized to have an appearance as shown in FIG. 1E. This provides a smooth gripping surface for the carrier wafer 116 of FIG. 1F. In FIG. 2B, the photoresist is ground down to the level of the copper bump. The grinding, polishing, or cutting may be deeper than the top surface of the copper bump to planarize the copper bump as well. This may aid in later attachment processes after the photoresist is removed. If a nitride hermetic seal layer 220 is present, this layer will be removed from the top of the wafer by the CMP, however, the sides of the photoresist are sealed. The top of the photoresist is covered by a carrier wafer as shown in FIG. 2C. The temporary carrier will be more securely attached after the CMP due to the smoother attachment surface and also because the nitride layer 220 has been removed across the attachment surface.

In FIG. 2C, the carrier wafer 216 is attached to the top surface of the wafer 202, which includes the photoresist 212 and the copper bumps 214. This allows the carrier wafer to attach to or adhere to almost 100% of the top surface of the processed wafer for an even more secure connection than for the example of FIG. 1F. With the top side attached to the carrier wafer, the back side of the wafer can be exposed for any desired processing. As with the example of FIG. 1I, a hermetic seal layer, such as compressive silicon nitride may be deposited over the photoresist and any other desired components to prevent or reduce outgassing from the photoresist.

Figure 2D:
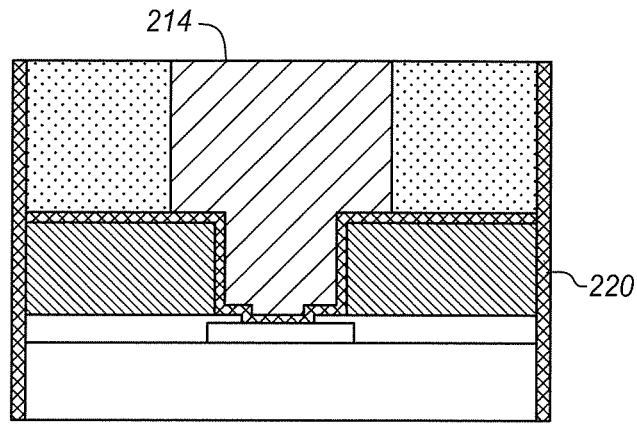
Figure 2E:
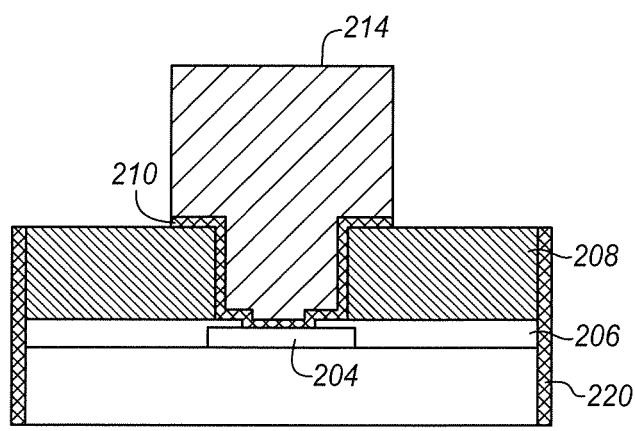

After the back side processing is completed, the carrier wafer 216 can be debonded or de-chucked as shown in FIG. 2D and the photoresist and excess CBS 210 etched away as shown in FIG. 2E.

Figure 3:
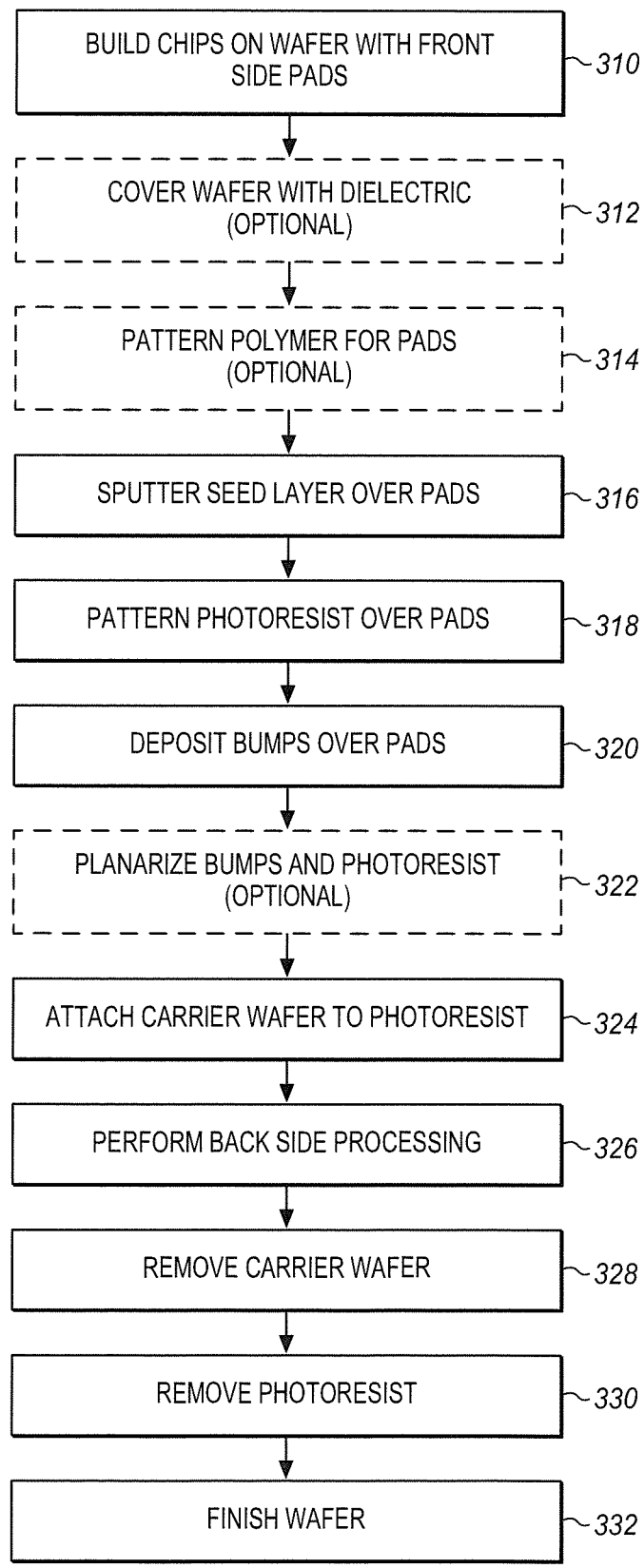
FIG. 3 is a process flow diagram of bonding a carrier wafer to patterned photoresist according to an embodiment of the invention.

FIG. 3 is a process flow diagram corresponding to the operations shown and described above. At 310 chips are formed on a wafer. The wafer may be processed on one or more sides. The wafer may be a silicon substrate or another type of substrate. The formed chips each have semiconductor circuitry that is connected externally through a pattern of electrical connection pads. As shown the pads are on the front side of the wafer, but the invention is not so limited.

At 312 the wafer including the die and the pads are covered with a dielectric. This is an optional operation. The dielectric may have a height that is less than the pads, as shown, or may be patterned so that the pads are exposed. At 314 a polymer is optionally patterned around the pads. The polymer may be used to provide support for the structure being formed over the pads. The structure shown and described herein provides a particular type of conductive bump on the front side of the die. However, the operations described herein may be modified to produce different types, shapes, and structures of bumps, depending on the particular implementation.

At 316 a seed layer is sputtered over the pads. The seed layer may be a CBS or any other suitable layer or combination of layers. The CBS may be sputtered only over the pads or sputtered over the whole wafer while the pads are exposed and the rest of the top of the wafer is covered in various dielectric, polymer, or other layers.

At 318 photoresist is patterned over the pads. The photoresist may be applied using any suitable photolithography technique. Typically, the photoresist is applied evenly over the entire surface of the wafer. The photoresist is then exposed to a suitable wavelength of light through a mask to form a particular pattern. The pattern exposes areas over the pads which are then removed after development or vice versa.

At 320 with the photoresist removed over the pads, metal is deposited in the exposed areas to form bumps, such as copper bumps, over the pads. The resulting surface of photoresist and copper may optionally be planarized at 322 over the bumps and photoresist. The top surface of the wafer may be polished, ground, cut or etched to achieve any desired amount of flatness. Even if only the photoresist is polished without reaching the metal bumps, this may provide a flatter overall surface than the photoresist as it was deposited.

At 324 a temporary carrier wafer is attached to the photoresist. The carrier wafer may be attached using any desired approach. With the carrier wafer attached to one side, for example the front side, of the wafer, processing may be applied to the other side of the wafer at 326, for example the back side. For back side processing there may or may not be a back side carrier wafer to remove, depending on how the back side of the wafer was secured and carried during front side processing.

With the back side processing completed at 328 the front side carrier wafer is removed by debonding or dechucking or any other way. This exposes the photoresist and the bumps. At 330 the photoresist can be removed together with any other desired layers, residue and other substances including release agents, dielectric films or other materials used in attaching the temporary carrier wafer. At 332 the wafer is finished. The remaining operations may be selected to suit the particular type of chip, wafer, and packaging technology for the implementation.

Figure 4:
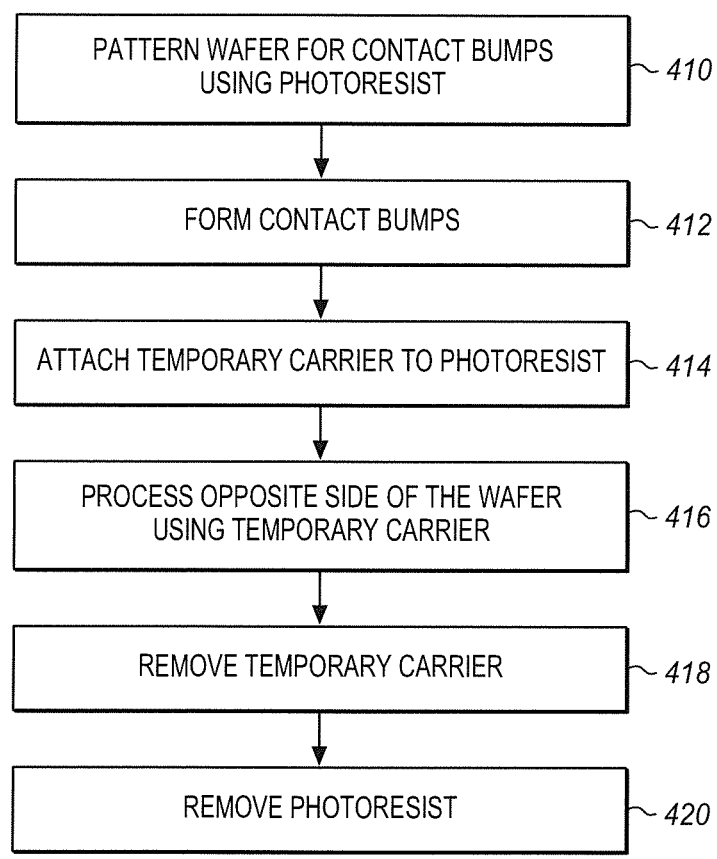
FIG. 4 is an alternative process flow diagram of bonding a carrier wafer to patterned photoresist according to an embodiment of the invention.

FIG. 4 is a simplified process flow diagram showing basic operations that are common to many of the embodiments described herein. At 410 a silicon wafer is patterned for a plurality of contact bumps by applying a photoresist over a surface of the wafer and then removing the photoresist in locations at which the contact bumps are to be formed. The photoresist may be patterned in any of a variety of different ways, depending on the particular implementation. The silicon wafer is already formed with underlying structures that will connect to the contact bumps after the bumps are formed.

At 412 the contact bumps are formed in the locations at which the photoresist is removed. At 414 a temporary carrier is attached to the photoresist over the wafer and the contact bumps. The contact bumps may or may not be attached to the temporary carrier as well. As mentioned above, the photoresist may be polished to form a flatter surface before the temporary carrier is attached. The photoresist may be polished all the way down to the bumps so that the bumps are also attached to the carrier.

At 416, the side of the wafer opposite the contact bumps is processed while the wafer is handled using the temporary carrier. In the described embodiments, the contact bumps are on the front side, the temporary carrier wafer is attached to the front side and the opposite side is the back side of the wafer. However, the same approach may be used to attach a temporary carrier to the back side of the wafer to process the front side.

At 418, after the opposite side processing, the temporary carrier is removed and then at 420 the photoresist on the front side of the wafer is removed. Any additional operations may be performed such as coating, overmolding, dicing, packaging etc.

The temporary carrier may be attached in any of a variety of different ways including using a spin coated adhesive and a releasing agent. In some embodiments, the releasing agent is activating upon baking the carrier and the wafer. The remaining adhesive and other materials may easily be removed when removing the photoresist at 420.

In another embodiment, the temporary carrier is a part of or is connected to an electrostatic chuck. The electrostatic chuck is moved into alignment with the front side of the wafer. The electrostatic force is then activated on the electrostatic chuck to grip the wafer or to directly grip the photoresist and, in some cases, the bumps.

Figure 5:
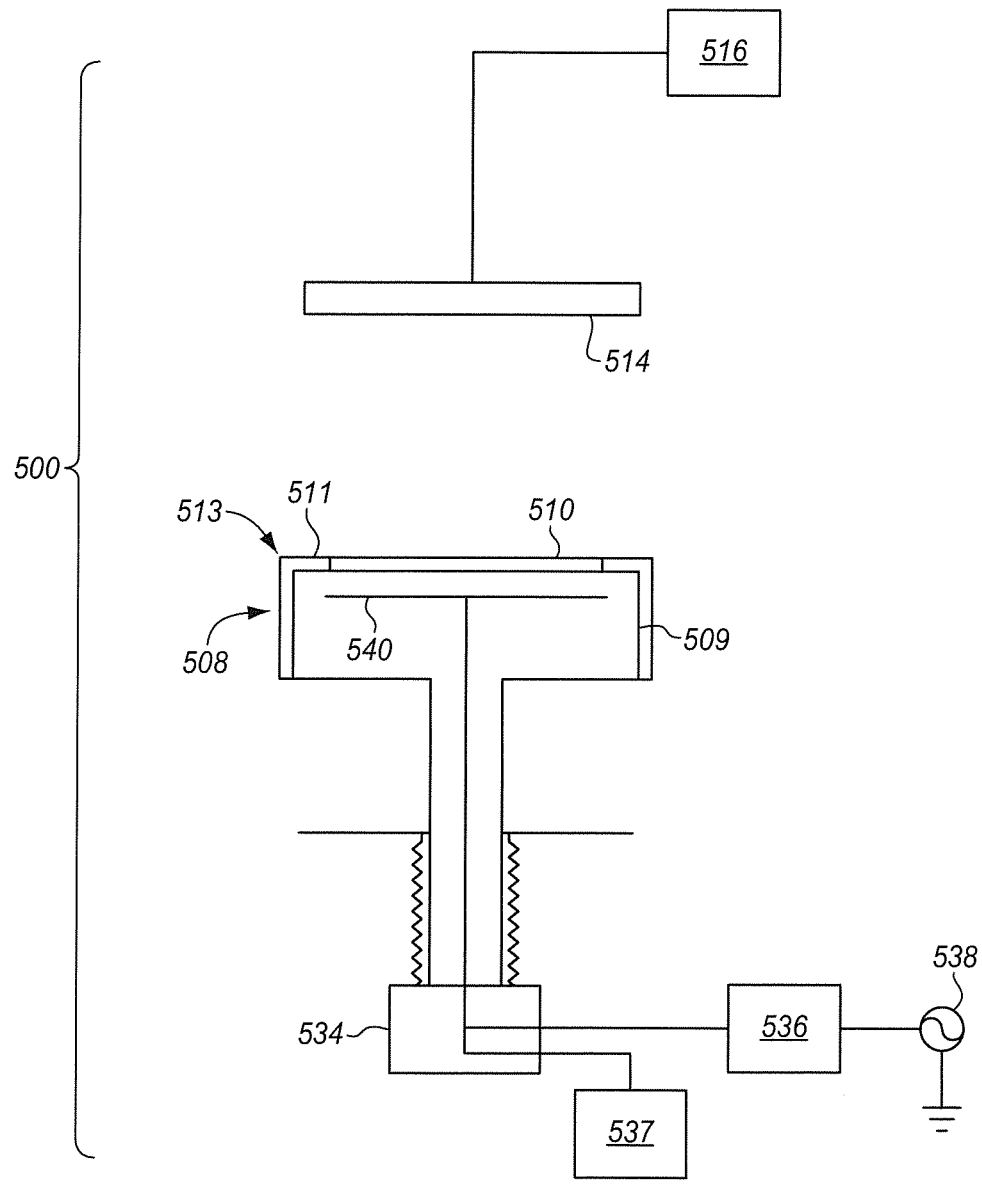
FIG. 5 is a diagram of an example of an electrostatic chuck suitable for use with the embodiments of the other figures shown in conjunction with a wafer processing chamber.

FIG. 5 is a diagram of an example of an electrostatic chuck suitable for use with the example above in conjunction with a wafer processing chamber. The process chamber 500 may comprise a chamber body 502 having a substrate support 508 comprising an electrostatic chuck 509 for retaining a substrate 510. Other types of process chambers having different configurations and more or less equipment than provided in this example may be used as an alternative to that shown here.

The chamber body 502 has an inner volume 507 that may include a processing volume 504 and an exhaust volume 506. The processing volume 504 may be defined, for example, between a substrate support 508 disposed within the process chamber 502 for supporting a substrate 510 during processing and one or more gas inlets, such as a showerhead 514 or other types of nozzles provided at any desired location.

The substrate 510 enters the process chamber 500 through an opening 512 in a wall of the chamber body 502. The opening 512 is opened or sealed by a slit valve 518. The substrate support 508 is coupled to a lift mechanism 534 to control the position of the substrate support 508 between a lower position (as shown) suitable for transferring substrates into and out of the chamber through the opening 512 and an upper position suitable for processing. The process position is selected to maximize process uniformity for a particular process step.

The gas inlets such as the showerhead 514 are coupled to a gas supply 516 for providing process gases into the processing volume 504 of the process chamber 502.

Plasma power sources 548 are also coupled to the process chamber 502 to supply RF power to an upper electrode such as the showerhead 514 through respective match networks 546. In some embodiments, the process chamber 500 uses inductively coupled RF power for processing. For example, the process chamber 502 has a ceiling 542 made from a dielectric material.

The exhaust volume 506 may be defined, for example, between the substrate support 508 and a bottom of the process chamber 502. The exhaust volume 506 is fluidly coupled to the exhaust system 520. The exhaust system 520 has a pumping plenum 524 and a conduit that couples the pumping plenum 524 to the inner volume of the process chamber 502.

Each conduit has an inlet 522 coupled to the inner volume 507 or the exhaust volume 506 and an outlet fluidly coupled to the pumping plenum 524.

A vacuum pump 528 is coupled to the pumping plenum 524 through a pumping port 526 for pumping out the exhaust gases from the process chamber 502. The vacuum pump 528 is fluidly coupled to an exhaust outlet 532 for routing the exhaust as required to appropriate exhaust handling equipment. A valve 530 is disposed in the pumping plenum 524 to allow the flow rate of the exhaust gases to be controlled.

In some embodiments, the substrate support 508 may include a process kit 513 with an edge ring 511 at the top of the substrate support 508. The edge ring 511 secures the substrate 510 for processing and protects the underlying substrate support 508 from damage during processing.

The substrate support 508 includes an electrostatic chuck (ESC) 509 to retain and support the substrate 510 on the surface of the substrate support 508. The ESC includes an electrode 540 coupled to a chucking power source 537, such as a DC or AC power supply. The electrode 540 is also or alternatively coupled to a bias power source 538 through a matching network 536. The electrode 540 may be embedded in a portion of the electrostatic chuck 509. For example, the electrostatic chuck 509 may have a dielectric plate to support the substrate. The dielectric plate may be in the form of a disc, or puck or any suitable shape corresponding to the shape of the substrate.

In some embodiments, a mobile or wireless ESC carrier is used to chuck to the device wafer. Accordingly, upon chucking the mobile ESC carrier to the device wafer, the two bonded wafer pair may be processed inside the chamber. Inside the chamber, the bonded wafer pair may be placed on a heater or ESC chucked to the pedestal.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" and "connected" along with their derivatives, may be used. "Coupled" is used to indicate that two or more elements co-operate or interact with each other, but they may or may not have intervening physical or electrical components between them.

In the following description and claims, the terms "chip" and "die" are used interchangeably to refer to any type of microelectronic, micromechanical, analog, or hybrid small device that is suitable for packaging and use in a computing device.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:
1. A method comprising:
  patterning a silicon wafer for a plurality of contact bumps by applying a photoresist over a front side surface of the wafer and removing the photoresist in locations at which the contact bumps are to be formed;
  forming the contact bumps in the locations at which the contact bumps are to be formed after the photoresist is removed in the locations;
  attaching a temporary carrier directly to the surface of the photoresist on the front side of the wafer over the wafer after forming the contact bumps;
  processing the back side of the wafer opposite the contact bumps while handling the wafer using the temporary carrier;
  removing the temporary carrier; and
  removing the photoresist on the front side of the wafer that was not removed during patterning the silicon wafer with the contact bumps after removing the temporary carrier.

2. The method of claim 1, wherein attaching a temporary carrier further comprises attaching the carrier to the contact bumps, wherein the carrier contacts the photoresist and the contact bumps.

3. The method of claim 2, further comprising grinding the photoresist to a height even to the formed contact bumps.

4. The method of claim 3, wherein grinding comprises chemical mechanical polishing.

5. The method of claim 3, wherein grinding comprises cutting the photoresist.

6. The method of claim 4, wherein grinding comprises planarizing the front side of the wafer to provide an even surface for the temporary carrier.

7. The method of claim 1, wherein attaching a temporary carrier comprises moving an electrostatic chuck into alignment with the front side of the wafer and activating the electrostatic chuck to grip the wafer.

8. The method of claim 1, wherein attaching a temporary carrier comprises spreading an adhesive over the temporary carrier and attaching the temporary carrier using the adhesive.

9. The method of claim 8, wherein spreading comprises spin coating the adhesive and a release agent to the temporary carrier.

10. The method of claim 1, further comprising applying as copper barrier seed layer by sputtering before applying the photoresist.

11. The method of claim 1, further comprising applying a polymer layer over the silicon wafer before applying the photoresist.

12. The method of claim 1, wherein the silicon wafer comprises a plurality of silicon chips formed on the wafer and wherein the contact bumps are connected to contacts of the silicon chips.

13. The method of claim 1, further comprising depositing a seal layer over the photoresist before processing the back side of the wafer.

14. The method of claim 13, wherein depositing the seal layer comprises depositing the seal layer over the temporary carrier after attaching the temporary carrier.

15. The method of claim 1, wherein depositing the seat layer comprises depositing the seal layer over the back side of the wafer after attaching the temporary carrier.

16. The method of claim 13, wherein applying a seal layer comprises depositing compressive silicon nitride.

* * * * *